United States Patent [19]

Kashioka et al.

[11] 4,334,241
[45] Jun. 8, 1982

[54] PATTERN POSITION DETECTING SYSTEM

[75] Inventors: Seiji Kashioka, Hachiouji; Yoshihiro Shima, Kokubunji; Takafumi Miyatake, Tokorozawa, all of Japan

[73] Assignee: Hitachi, Ltd., Tokyo, Japan

[21] Appl. No.: 140,415

[22] Filed: Apr. 14, 1980

[30] Foreign Application Priority Data

Apr. 16, 1979 [JP] Japan .................................. 54-45353

[51] Int. Cl.³ ............................................. H04N 7/18
[52] U.S. Cl. .................................. 358/107; 358/903; 364/515; 340/146.3 AC
[58] Field of Search ................. 358/105, 93, 107, 101, 358/106, 903; 340/146.3 H, 146.3 Q, 146.3 AC, 146.3 AE; 364/515, 559; 356/388, 390, 397

[56] References Cited

U.S. PATENT DOCUMENTS

| | | | |
|---|---|---|---|
| 4,115,805 | 9/1978 | Morton | 358/107 |
| 4,186,412 | 1/1980 | Arimura | 358/107 |
| 4,208,675 | 6/1980 | Bajon et al. | 358/107 |
| 4,281,342 | 7/1981 | Ueda et al. | 358/93 |

Primary Examiner—John C. Martin
Assistant Examiner—Edward L. Coles

Attorney, Agent, or Firm—Craig and Antonelli

[57] ABSTRACT

A pattern position detecting system includes an image pickup device to pick up the image of an object which includes a target pattern which is to be detected. On the basis of the output of the pickup device, local patterns of the image surface are successively cut out and positional coordinates of the local patterns are successively generated to indicate the typical positions of each of these local patterns. The respective local patterns are then compared with a standard pattern having the same feature as that of the target pattern and the degree of coincidence therebetween is detected. The different degrees of coincidence of the local patterns in the vicinity of a particular local pattern are then compared so as to successively sample the local pattern whose degrees of coincidence become a maximum, and the positional coordinates and degrees of coincidence of the respective local patterns whose degrees of coincidence become a maximum are then stored. The positional coordinates fulfilling the positional relationship inherent to the target pattern from among the positional coordinates finally selected are then sampled and the sampled positional coordinates are identified as indicating a position of the target pattern.

7 Claims, 16 Drawing Figures

FIG. 3
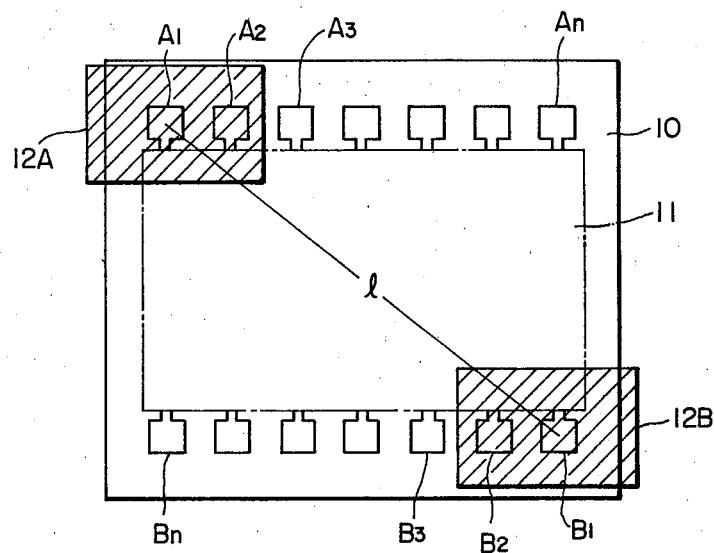
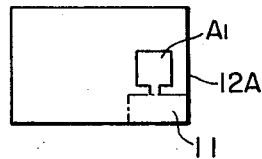
FIG. 4(a)
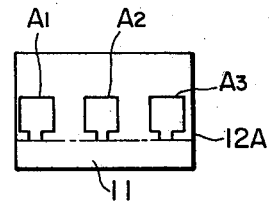
FIG. 5(a)
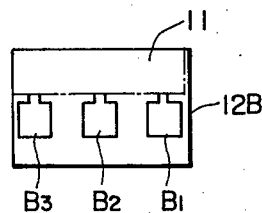
FIG. 4(b)
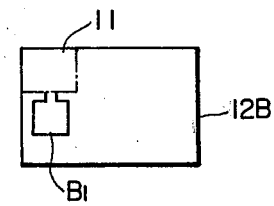
FIG. 5(b)

PATTERN POSITION DETECTING SYSTEM

BACKGROUND OF THE INVENTION (1) Field of the Invention

This invention relates to a pattern position detecting system, and more particularly to a pattern position detecting system which automatically and speedily detects the position of a specified pattern existent on the surface of an object body by utilizing an imaging device.

(2) Description of the Prior Art

Systems wherein a certain target pattern is sampled from among images picked up by an imaging device such as television camera, in a manner to be distinguished from other patterns and a background pattern and has its position within a two-dimensional image obtained, have been already proposed in Japanese Patent Application Publication No. 52-14112 (U.S. Pat. No. 3,898,617) and Japanese Published Unexamined Patent Application No. 52-91331. These systems find the specified position of an object in such a way that a local pattern of an object surface is stored as a standard pattern in advance, that the standard pattern and partial patterns cut out in various positions within the image as fed by the imaging device are successively compared, and that positional coordinates typical of the partial pattern which best coincide are sampled. These systems are applied to, for example, the position detection of a semiconductor pellet when the wire bonding between bonding pads formed on the semiconductor pellet and lead fingers is automatically carried out.

In the prior-art systems, however, the target pattern is identified by finding the position of the pattern best coincident with the standard pattern within the image, so that only a pattern having an inherent feature which is not included in the other patterns on the object can become the target pattern. Accordingly, in case where a pattern having such an inherent feature does not exist on the object or where the pattern having the inherent feature exists only in a position which is inconvenient for grasping the positional deviation or rotational deviation of the object, the prior-art systems cannot achieve the expected purpose and their ranges of applications have been limited.

For example, when a part of a digitated electrode of a high power transistor having cyclic patterns or one of a plurality of electrodes or bonding pads in the same shape as formed in the edges of a chip of an IC (integrated circuit) or an LSI (large scale integration) is intended to have its position detected as the target pattern, the electrode part to be made the detection target needs to be put into a special shape at the stage of the design of the electrode pattern in order to apply either of the prior-art systems.

SUMMARY OF THE INVENTION

An object of this invention is to provide a pattern position detecting system which can reliably identify a target pattern even in case where a plurality of patterns having the same feature as that of the target pattern to be detected exists on an object.

In order to accomplish the object, according to this invention, positional coordinates are detected for all patterns which lie in a pattern search area and which have the same feature as that of a target pattern, and from among the detected positional coordinates, positional coordinates which satisfy an inherent positional relationship lying between the target pattern and another pattern on an object are sampled, whereby the position of the target pattern is identified.

More precisely, the pattern position detecting system according to this invention is characterized by comprising imaging means to pick up an image of an object which includes a target pattern to-be-detected, first means to successively cut out local patterns of an image surface on the basis of image signals delivered from said imaging means, second means to generate positional coordinates which indicate typical positions of the respective local patterns cut out, third means to compare the respective local patterns with a standard pattern having the same feature as that of the target pattern and to obtain degrees of coincidence, fourth means to compare the degree of coincidence with the degrees of coincidence of the other local patterns in the vicinity of the particular local pattern so as to successively sample the local patterns whose degrees of coincidence become the maximum, said fourth means storing the positional coordinates and degrees of coincidence of the respective local patterns, and fifth means to sample positional coordinates fulfilling a positional relationship inherent to the target pattern from among the positional coordinates finally left in said fourth means, the sampled positional coordinates being identified as indicating a position of said target pattern.

The foregoing and other objects, advantages, manner of operation and novel features of the present invention will be understood from the following detailed description when read in connection with the accompanying drawings.

BRIEF DESCRIPTION OF THE DRAWINGS

FIG. 3 is a diagram showing another example of an object for position detection, FIGS. 4a and 4b and FIGS. 5a and 5b are diagrams of pattern states in pattern search areas 12A and 12B at the time when the object has undergone positional deviations.

DESCRIPTION OF THE PREFERRED EMBODIMENTS

First of all, the principle of this invention will be described.

Figure 1A:
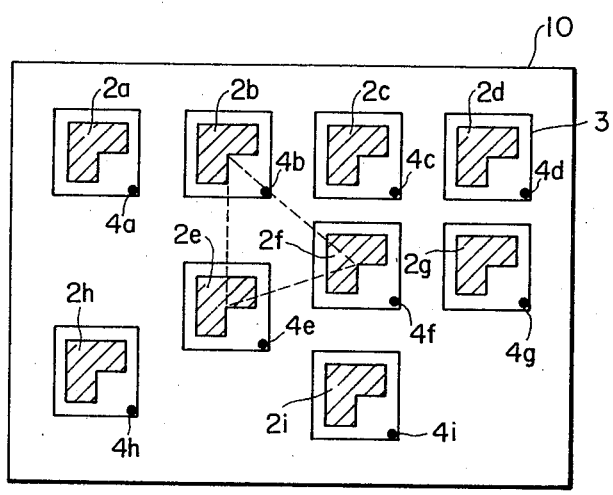
FIGS. 1(a) and 1(b) are diagrams showing patterns on an object and a standard pattern for explaining the principle of this invention.
Figure 1B:

By way of example, FIG. 1(a) shows an object 10 which includes a plurality of patterns 2a–2i having the same shape. Assuming here that the pattern 2b is a target to-be-detected, a standard or reference pattern as shown in FIG. 1(b) having the same feature as that of the target pattern 2b is prepared in advance. Partial patterns 3 each having the same size as that of the standard pattern are cut out or segmented from the image of the object successively in accordance with the scanning of the picture surface. The respective partial patterns are compared with the standard pattern, and the positional coordinates of the partial patterns at the times when they have coincided are stored in succession.

Each of the partial patterns and the standard pattern consists of a plurality of picture elements. Which of the picture elements is used to represent the positional coordinates of the partial pattern is arbitrary. Supposing that the positional coordinates of the partial pattern are represented by a picture element (illustrated by a black dot in the drawing, and hereinafter called "typical point") at the right lower corner of the partial pattern, then the positional coordinates of typical points 4a–4i can be obtained by the above processing.

The target pattern 2b has, with respect to e.g. the patterns 2e and 2f, such a positional relationship that they occupy the respective apices of a triangle indicated by broken lines. This positional relationship is a relationship which is peculiar to the above set of patterns and which does not exist among the other patterns on the object. Regarding such a positional relationship peculiar to the target pattern 2b, note may well be taken of a triangle which is formed among it and other patterns than the aforecited ones 2e and 2f, for example, the patterns 2h and 2i or the patterns 2h and 2g.

In this invention, one set of typical points fulfilling the foregoing positional relationship peculiar to the target pattern are sought out from among the plurality of typical points stored as the points coincident with the standard pattern, and the target pattern is identified on the basis of the relative positional relationship among the respective typical points in this set.

In the pattern recognition employing an imaging device, a pattern actually picked up is difficult to perfectly coincide with the standard pattern on account of various fluctuating factors even when it is the true target pattern. Therefore, a certain extent of error cannot help being permitted for the result of the comparison between the partial pattern and the standard pattern. In this case, when a system is adopted wherein all the partial patterns whose degrees of coincidence with the standard pattern are at least a predetermined value have their positional coordinates stored, the positional coordinates of the large number of partial patterns which are cut out around and from near a partial pattern position indicative of the highest degree of coincidence are stored in a memory, and the memory needs to have a large storage capacity. In addition, it is necessary in this system that, from among a group of coordinate data, the positional coordinates of the highest degree of coincidence as lie in the center thereof are sampled, and that the data are properly arranged so that a single coordinate position may remain for one pattern on the object.

In order to eliminate such inconveniences, according to this invention, only when the degree of coincidence between a local pattern and a standard pattern has become a maximum value in the vicinity of the particular local pattern, the positional coordinates of the local pattern are sampled.

In order to sample the coordinates at the maximum point of the degree of coincidence between the local pattern and the standard pattern, there may be adopted, for example, a measure wherein the search area of a pattern is divided into a plurality of sections ($n_1$ sections in a Y-direction and $n_2$ sections in an X-direction), and the positional coordinates of partial patterns whose degrees of coincidence with the standard pattern are evaluated for the respective sections so as to sample the partial patterns whose degrees of coincidence are at least a predetermined value.

Figure 2:
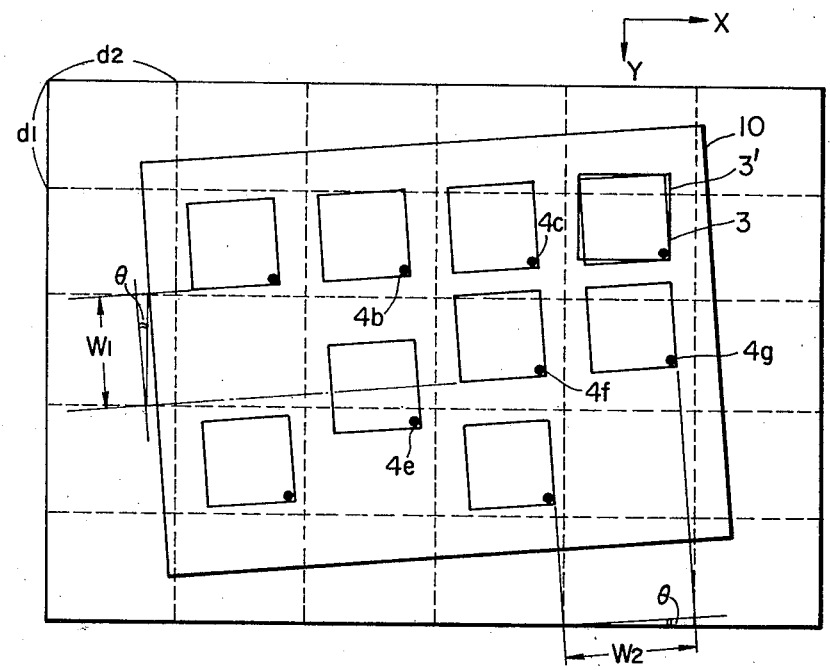
FIG. 2 is a diagram for explaining an example of a method of storing the positional coordinates of a plurality of patterns coincident with a standard pattern in this invention.

FIG. 2 shows an example in which the imaged picture surface of the object 10 shown in FIG. 1 is divided into 5×6 sections. The size ($d_1$ in height and $d_2$ in width) of each section is determined by the dimensions and positional relationships of patterns having the same feature as that of the target pattern which is expected to exist in the search area. By way of example, as illustrated in the figure, the dimensions $d_1$ and $d_2$ of the section are set so as to hold:

$$d_1 < w_1 \cos \theta$$

$$d_2 < w_2 \cos \theta$$

where $w_1$ denotes the interval between the respective typical points 4c and 4f of the patterns being the closest in the vertical direction on the object, $w_2$ denotes the interval between the respective typical points 4f and 4g of the patterns being the closest in the horizontal direction, and $\theta$ denotes the maximum allowable angle of rotational deviations of the object supplied into the imaging field of view. Thus, even when the object involves a positional deviation or rotational deviation, the typical points of all the patterns to be detected can be received in any sections one by one in such a manner that two or more points are never included in one section. Accordingly, when a partial pattern which exhibits the maximum degree of coincidence with the standard pattern is sampled from among partial patterns which are successively cut out and whose typical points belong to the same section, any failure to detect the position of a pattern does not occur. In FIG. 2, to the end of clarifying the contrast with the object 10 in FIG. 1, the partial pattern 3 is illustrated in the state in which it inclines relative to the imaged picture surface. However, the actual cut-out position of the partial pattern from the imaged picture surface extends along the X- and Y-axes as indicated at 3'.

The foregoing is the example wherein the whole object is imaged within one field of view and wherein one set of positional coordinates lying in the positional relationship inherent to the target pattern are sampled from among the positional coordinates detected within the identical field of view. This invention, however, is also applicable to a case where as will be stated hereunder, parts of an object are enlarged and imaged and then one set of positional coordinates lying in a positional relationship inherent to a target pattern are found among positional coordinates detected in the individual fields of view.

As an example thereof, FIG. 3 shows a semiconductor pellet 10 in which pads $A_1$–$A_n$ and $B_1$–$B_n$ are regularly formed on both sides of a circuit element forming region 11. In the semiconductor pellet, by way of example, the two pads $A_1$ and $B_1$ which are at the longest distance l are used as target patterns, and pattern search areas 12A and 12B are set in positions which include the respective pads at substantially central parts thereof. Let it be supposed to first enlarge and pick up the image of the search area 12A and to subsequently move the imaging field of view a predetermined distance and pick up the image of the search area 12B. Then, in case where, by way of example, the pellet 10 has undergone a positional deviation rightwards a component of one pad from the position of FIG. 3, patterns as shown in FIGS. 4a and 4b are picked up in the search areas 12A and 12B respectively. On the other hand, when the pellet 10 has undergone a positional deviation leftwards a component of one pad, patterns within the respective search areas become as shown in FIGS. 5a and 5b.

Referring to these figures, the patterns having the same feature appear in the respective search areas in numbers which differ each time in accordance with the positional deviations of the object, and hence, the target pads $A_1$ and $B_1$ cannot be identified in the individual areas. When it is determined that the leftmost pattern is the target pad in the search area 12A while the rightmost pattern in the search area 12B, an erroneous recognition is feared when a noise pattern is involved. However, if one set of positional coordinates lying in the positional relationship of the distance l are sampled among the positional coordinates of the pads included in the search areas 12A and 12B, those of the search area 12A in the set of positional coordinates can be identified to correspond to the pad $A_1$ and those of the search area 12B to correspond to the pad $B_1$.

Hereunder, an embodiment of a pattern position detecting system according to this invention will be described.

Figure 6:
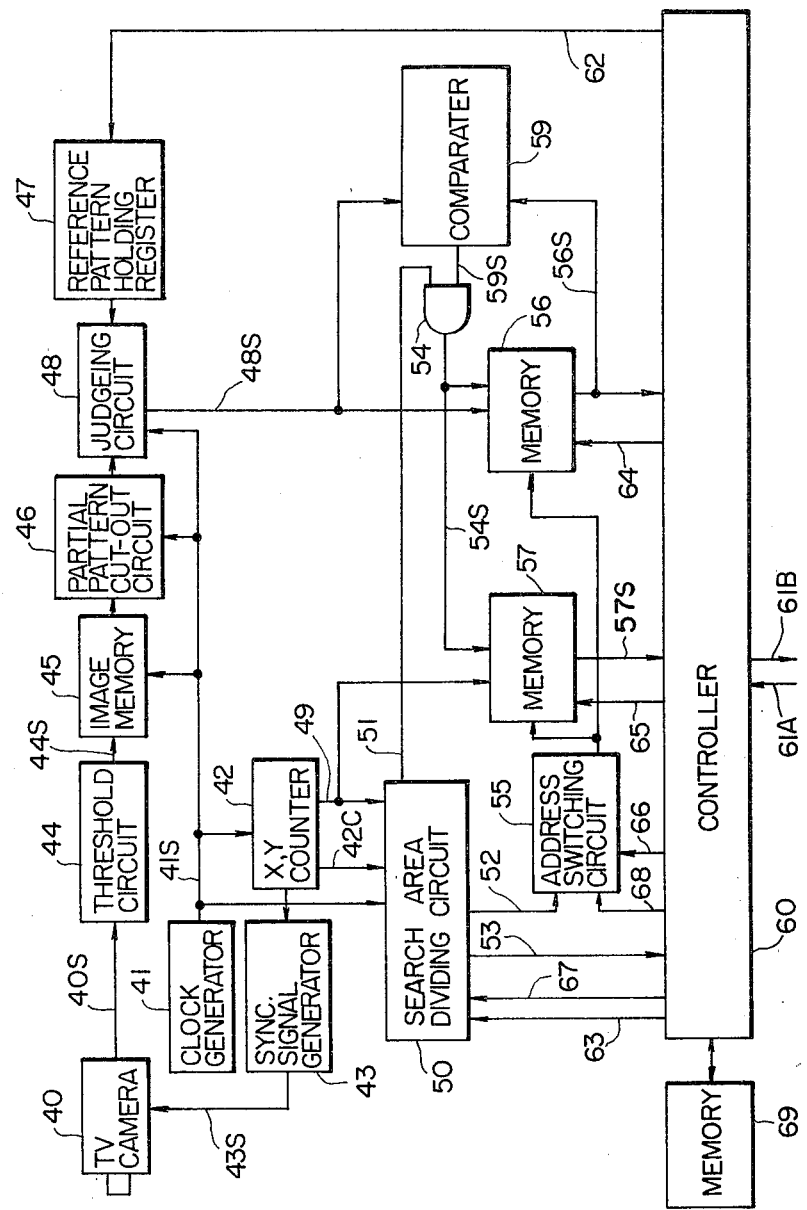
FIG. 6 is a general arrangement diagram of a pattern position detecting system showing an embodiment of this invention.

FIG. 6 is a block diagram showing the general construction of the pattern position detecting system. Numeral 40 designates an imaging device, for example, television camera, and numeral 41 a clock generator. A clock signal $41_s$ which is delivered from the clock generator 41 is applied to an X-Y coordinate counter 42. The X-Y coordinate counter 42 consists of an X-abscissa counter which counts the clock signal pulses $41_s$ to obtain the abscissa of an imaged picture surface, and a Y-ordinate counter which counts carry signal pulses $42_c$ of the X-abscissa counter to obtain the ordinate of the imaged picture surface. Numeral 43 indicates a synchronizing signal generator, which generates a synchronizing signal $43_s$ necessary for the picture surface scanning of the imaging device 40 on the basis of the count values of the X-Y coordinate counter 42.

The imaging device 40 raster-scans the image surface in synchronism with the synchronizing signal $43_s$ and provides an image signal $40_s$. The image signal $40_s$ is converted by a threshold circuit 44 into a binary signal $44_s$ indicating whether the image of a picture element is "white" or "black", the binary signal being supplied to an image memory 45.

As the image memory 45 and a partial pattern cutting-out or segmenting circuit indicated by symbol 46, circuits of the type disclosed in the specification of Japanese Patent Application Publication No. 52-14112 (U.S. Pat. No. 3,898,617) are applicable.

More specifically, the image memory 45 is composed of (n−1) shift registers which are connected in series with one another and which serve to temporarily store binary-coded picture information corresponding to (n−1) scanning lines. Output signals of these registers and the binary signals $44_s$ correspond to n picture elements lying in the positional relationship in which they are arrayed in the vertical direction on the imaged picture surface. Accordingly, when the signals of the n picture elements are fetched in parallel from the image memory 45, they are led to the partial pattern cutting-out circuit 46 composed of n shift registers each having a length of n bits, and they are fetched as parallel information of (n×n) bits, then the partial patterns of the (n×n) picture elements corresponding to the scanning positions of the image are successively taken out.

Numeral 47 designates a register for holding a reference or standard pattern which is made up of information of (n×n) picture elements to be compared with the partial patterns. The content of this register and the output of the partial pattern cutting-out circuit 46 are compared and checked up at the respectively corresponding bits by means of a judging or decision circuit 48. The total number of bits whose contents coincide is delivered from the decision circuit 48 as a signal $48_s$ indicative of the degree of coincidence between the partial pattern and the standard pattern. Since the circuits 45, 46 and 48 operate in synchronism with the clock signal $41_s$, the coincidence signals $48_s$ are successively provided in parallel with the scanning of the image surface.

Figure 7:
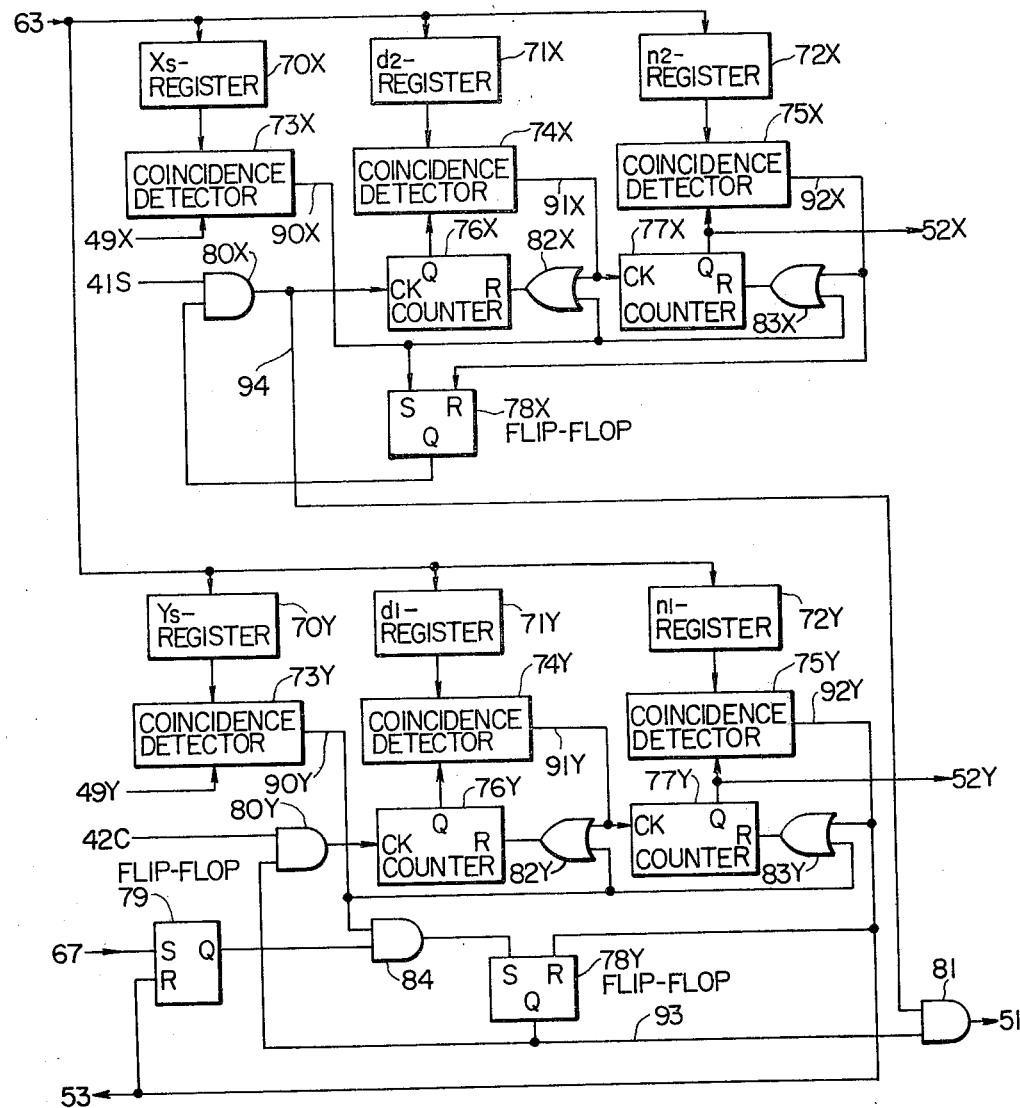
FIG. 7 is a detailed arrangement diagram of a search area dividing circuit 50 in the system of FIG. 6, FIGS. 8a to 8c and FIGS. 9a to 9c are diagrams for explaining further embodiments of this invention each employing a plurality of sorts of standard patterns.

Shown at 50 is a search area dividing circuit (the concrete construction of which will be described with reference to FIG. 7). It operates in synchronism with the clock signal $41_s$, and it decides whether or not the present scanning point falls within a search area, on the basis of the carry signal $42_c$ of the X-counter and an X-Y coordinate signal 49 ($49_X$, $49_Y$) as are provided from the X-Y coordinate counter 42. If the present scanning point lies in the search area, a coincidence comparison instruction signal 51 is provided. In addition, this circuit divides the search area into a plurality of sections and generates an address signal 52 ($52_X$, $52_Y$) indicating which section the scanning point belongs to. The address signal 52 is applied to a coincidence memory 56 and a coordinate memory 57 through an address switching circuit 55.

The coincidence memory 56 has memory areas corresponding to the address signals 52, and can store the maximum degrees of coincidence between the partial pattern and the standard pattern up to the present time for the respective sections corresponding to the addresses in the search area. More specifically, the contents of the addressed memory areas of the memory 56 are read out as signals $56_s$, and they are applied to a comparator 59 together with the coincidence signals $48_s$ delivered from the circuit 48 in succession. The comparator 59 provides a pulse signal $59_s$ when the degree of coincidence $48_s$ obtained anew is greater. The pulse signal $59_s$ is applied to an AND gate 54 which is enabled or disabled by the coincidence comparison instruction signal 51. It is delivered from the AND gate 54 during only the output period of the comparison instruction signal 51, and becomes a pulse $54_s$ permitting the memories 56 and 57 to update data. In response to the pulse signal $54_s$, accordingly, the coincidence memory 56 can store the new degree of coincidence given by the signal $48_s$ in the memory area corresponding to the address signal 52.

On the other hand, the coordinate memory 57 has coordinate memory areas corresponding to the address signals 52 similar to the coincidence memory 56. When the coordinate memory has been given the pulse signal $54_s$, it stores the coordinate data 49 delivered from the X-Y coordinate counter 42 in the addressed memory area thereof.

The scanning of the picture surface is performed repeatedly in the X-direction while shifting positions in the Y-direction, so that the addresses of the sections within the search area change successively in accordance with the picture surface scanning. At the time when the scanning of one picture surface has ended, the maximum degree of coincidence between the standard pattern and the partial pattern and the positional coordinates of the partial pattern concerning all the sections are stored in the memories 56 and 57.

Shown at 60 is a controller, which is a device having the functions of the input/output, sequence control and numerical control of information and the decision of data, for example, an electronic computer. Upon receiving an external start signal $61_A$, the controller 60 starts control operations in conformity with a procedure programmed in advance. First, a necessary standard pattern 62 is sent into the register 47, and parameters such as the dimensions $d_1$ and $d_2$ of the section, the numbers of divisions $n_1$ and $n_2$ and the coordinates $X_s$ and $Y_s$ of the starting point of the search area are sent into the search area dividing circuit 50 through a signal line 63. Clear signals 64 and 65 are respectively applied to the coincidence memory 56 and the coordinate memory 57 so as to clear the contents of the memories, whereupon a switching signal 66 is delivered so as to permit the address switching circuit 55 to provide an address from the search area dividing circuit 50.

When these pre-processing operations have ended, the control circuit 60 supplies the search area dividing circuit 50 with a start instruction signal 67 for a pattern detecting operation. Upon receiving the instruction signal 67, the search area dividing circuit 50 starts the operation for detecting a pattern at the timing at which the picture surface scanning of the imaging device 40 has returned to the initial position. When the scanning of one picture surface has ended, the circuit 50 provides an end signal 53 to inform the controller of the end of the pattern detecting operation.

Upon receiving the end signal 53, the controller 60 provides the switching signal 66 to establish the state in which the address switching circuit 55 can access the memories 56 and 57 by the use of an address signal 68 provided from the controller. Thus, the controller 60 successively reads out the degrees of coincidence of the respective sections stored in the coincidence memory 56 and decides whether or not they are at least a predetermined value. If they are at least the predetermined value, coordinate values are read out from the coordinate memory 57 and are written into a memory 69 on the controller side.

In case where pattern search areas have been set in separate imaging fields of view on the object, the following measure may be taken. That is, positional coordinate data detected in the first search area is written into a first search area data-area of the memory 69, after which the controller 60 provides a control signal $61_B$ for moving the imaging field of view to the second search area. Then, the foregoing operation is repeated to cause the search area dividing circuit 50 to execute the pattern detecting operation in the second search area, and coordinate data is read out from the coordinate memory and written into a second search area data-area of the memory 69. In case where three search areas have been set on the object, operations similar to the above are repeated on a third search area.

When the coordinate data sampling processing thus far described has ended, the controller 60 sequentially checks the relative positional relationships of the coordinates within the memory 69, finds out one set of coordinates satisfying a predetermined positional relationship and identifies them as the positional coordinates of the target pattern. In case of adopting the form in which the imaging field of view is moved thereby to switch one search area to another search area, the positional coordinates of patterns obtained in the respective search areas are values with their origins being the scanning starting points of the respective imaging fields of view, and hence, the coordinate values in the second and third search areas need to be corrected in accordance with the amounts of movements of the fields of view. The corrections of these coordinate values may be made either at the time of moving the data from the coordinate memory 57 to the memory 69 or at the stage of deciding the relative positional relationships among the coordinates.

In deciding the relative positional relationships among the coordinates, by way of example, first coordinates are selected from the first search area, and the distances between them and the respective coordinates of the second search area are successively calculated, thereby to find out one set of coordinates having the predetermined distance 1. If such set is not found out, there may be repeated the procedure in which the next coordinates are selected from the first search area and the relations with the respective coordinates of the second search area are decided with reference to the selected coordinates. In case where the third search area has been set, only the set lying in the predetermined positional relationship in the first and second search areas has the relation with the coordinates of the third search area confirmed.

In case where the object is supplied to the imaging field of view at high positional accuracy and where the sampling order of the coordinates corresponding to the target patterns among the coordinates to be sampled in the respective search areas is substantially fixed, the processing time of data can be shortened by setting a procedure so that these coordinates may be firstly subjected to the decision of the relative positional relationship and that when the predetermined positional relationship is not met, the other coordinates may be decided.

If the positions of two fixed points on the object have been known, the magnitude of deviation from the standard position of the object can be calculated at 150, and the actual position of another fixed point previously known in a standard coordinate system can be evaluated by a coordinate transformation at 152. Accordingly, in case where the controller 60 is employed for controlling a wire bonding equipment for a semiconductor pellet, it is possible to calculate the magnitude of the positional deviation of the semiconductor pellet and the actual positions of respective pads to-be-bonded from the positional coordinates of the two target patterns and to control the amount of movement of an X-Y table for a capillary on the basis of the calculated results as at 154.

The concrete arrangement of the search area dividing circuit 50 will be explained with reference to FIG. 7.

This circuitry consists of an X-address control portion and a Y-address control portion. 70X and 70Y indicate registers for holding the coordinates $X_s$ and $Y_s$ of the start point of the search, respectively, 71X and 71Y indicate registers for holding the X-directional and Y-directional dimensions $d_2$ and $d_1$ of one divided section, respectively, and 72X and 72Y indicate registers for holding the numbers $n_2$ and $n_1$ of the sections in the X-direction and Y-direction, respectively. The parameters to be held in these registers are sent in from the controller 60 through the signal line 63. 73X, 73Y, 74X, 74Y, 75X and 75Y indicate coincidence detector circuits, 76X, 76Y, 77X and 77Y indicate counters, 78X, 78Y and 79 indicate flip-flops, 80X, 80Y, 81 and 84 indicate AND gates, and 82X, 82Y, 83X and 83Y indicate OR gates, respectively.

First, the operation of the X-address control portion will be described. The coincidence detector circuit 73X compares the X-abscissa $49_X$ of the scanning point delivered from the coordinate counter 42 and the abscissa $X_s$ of the search starting point held in the register 70X, and provides a pulse signal $90_X$ upon coincidence. This pulse signal $90_X$ sets the flip-flop $78_X$, and also resets the values of the counters 76X and 77X into zero through the OR gates 82X and 83X respectively. When the flip-flop 78X has become the set state, its output enables the AND gate 80X, and the fundamental clocks $41_s$ are successively applied to the counter 76X, so that the counting operation is conducted.

The coincidence detector circuit 74X provides a pulse signal $91_X$ when the value of the counter 76X has coincided with the lateral width $d_2$ of one divided section held in the register 71X. This pulse signal $91_X$ is applied to the counter 77X to increment the count value by one, and is also applied to the reset terminal of the counter 76X through the OR gate 82X. Accordingly, the counter 76X repeats the counting operation every count value equal to the lateral width of the divided section, and it increments the value of the counter 77X each time the scanning point shifts from one section to the next section in the X-direction. The content of the counter 77X becomes a value indicating which section in the lateral direction the scanning is being performed in, and this value is provided as the signal $52_X$ indicating the X-address of the section.

The coincidence detector circuit 75X compares the value of the counter 77X and the appointed X-directional number $n_2$ of the section held in the register 72X, and provides a pulse signal 92X upon coincidence. The pulse signal 92X is applied through the OR gate 83X to the reset terminal of the counter 77X so as to return the value of the counter, and also resets the flip-flop 78X so as to disable the AND gate 80X and to block the entry of the fundamental clocks $41_s$. Since these operations are repeated every horizontal scanning line, the signals $52_X$ indicative of the X-addresses of the divided sections within the search area are repeatedly provided.

Subsequently, the Y-address control portion will be described. In the Y-address control portion, when the instruction signal 67 for starting the detecting operation has been delivered from the controller 60, the flip-flop 79 is set and the AND gate 84 is enabled. The coincidence detector circuit 73Y compares the Y-ordinate $49_Y$ of the scanning point provided from the coordinate counter 42 and the ordinate $Y_s$ of the search starting point held in the register 70Y, and provides a pulse signal $90_Y$ upon coincidence. This pulse signal $90_Y$ resets the counters 76Y and 77Y through the OR gates 82Y and 83Y respectively, and if the AND gate 84 is enabled, the signal sets the flip-flop 78Y therethrough. Thus, the AND gate 80Y is enabled, and the carry signals $42_c$ provided from the coordinate counter 42 at the respective horizontal scanning lines are successively applied to the counter 76Y, so that the counting operation is conducted.

The coincidence detector circuit 74Y provides a pulse signal 91Y when the value of the counter 76Y has coincided with the vertical width $d_1$ of one divided section held in the register 71Y. This pulse signal is applied to the counter 77Y to increment the count value by one, and is also applied through the OR gate 82Y to the reset terminal of the counter 76Y to reset the value thereof. Accordingly, the counter 76Y repeats the counting operations with the periods being the count values equal to the vertical width of the divided section, and it causes the counter 77Y to perform the counting operation each time the scanning point has shifted from one section to the next section in the Y-direction. The content of the counter 77Y becomes a value indicating which section in the vertical direction the scanning is being executed in, and this value is provided as the signal $52_Y$ indicative of the Y-address of the section. The signal $52_Y$ is given to the coincidence memory 56 and the coordinate memory 57 shown in FIG. 6, together with the signal $52_X$ indicative of the X-address.

The coincidence detector circuit 75Y compares the value of the counter 77Y and the appointed vertical number $n_1$ of the section held in the register 72Y, and provides a pulse signal 92Y upon coincidence. This pulse signal 92Y resets the counter 77Y through the OR gate 83Y, and simultaneously resets the flip-flops 78Y and 79. In addition, the pulse signal is sent to the control circuit 60 as the end signal 53 of the pattern detecting processing as appointed.

Since the flip-flop 78Y is in the "on" state for just one scanning period of the search area, the coincidence comparison instruction signal 51 is obtained by deriving from the AND gate 81 the AND output between an output signal 93 of the flip-flop 78Y and an output signal 94 of the AND gate 80X of the X-address control portion.

In the foregoing embodiment, it has been explained that the comparisons with the partial patterns are made by the use of the single standard pattern in order to detect the target pattern. In the pattern position detecting system according to this invention, however, a high degree of pattern recognition can be carried out by preparing a plurality of sorts of standard patterns.

Figure 8A:
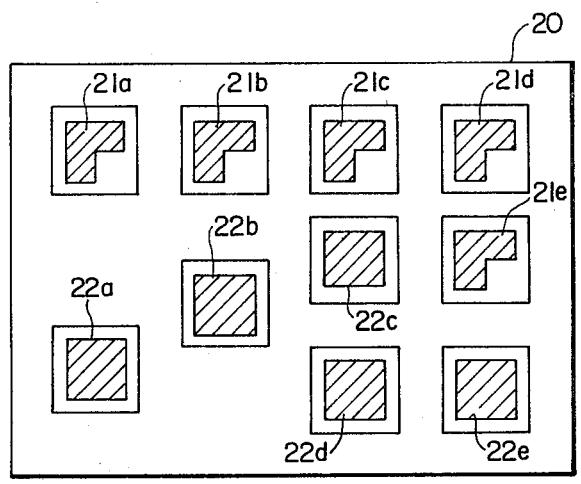
Figure 8B:
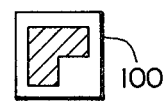
Figure 8C:
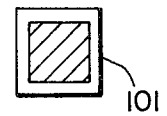

By way of example, the standard pattern to be sent from the controller 60 to the register 47 is changed, whereby a target pattern having a different feature can be detected from the object. FIGS. 8a to 8c show an example thereof. By employing a standard pattern 100 shown in FIG. 8b in the first picture surface scanning, the positional coordinates of patterns 21a–21e on an object 20 shown in FIG. 8a can be sampled, and by employing a standard pattern 101 in FIG. 8c in the next picture surface scanning, the positional coordinates of patterns 22a–22e can be detected. In this way, a target pattern position which lies in an inherent positional relationship between the patterns having different features can be detected.

In case where the deviation of the object in the rotational direction has exceeded a certain limit, a target pattern really existing in a search area fails to be detected when the threshold value for the decision of the degree of coincidence is made severe because the degree of coincidence is insufficient with a comparison with a standard pattern in its normal position. Also in such case, the recognizing capability can be enhanced in the way that a plurality of sorts of standard patterns corresponding to the inclinations of the object are prepared in advance and that when the target pattern cannot be detected with the first standard pattern, the remaining standard patterns are used for comparisons.

Figure 9A:
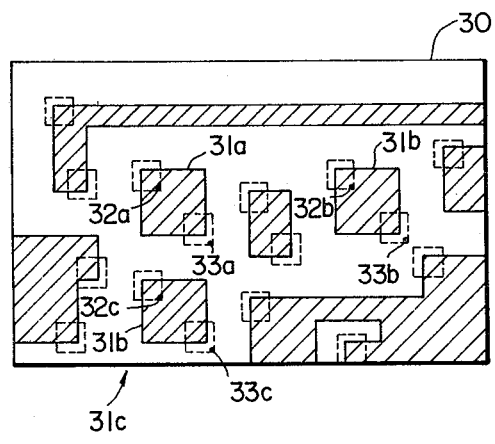

In case where a body 30 having minute patterns as shown in FIG. 9a is an object, the resolution can be enhanced by enlarging and imaging the vicinities of a target pattern 31a and patterns 31b and 31c which lie in inherent positional relationships with the target pattern.

Figure 9B:
Figure 9C:

In this case, when it is intended to compare the whole target pattern with a standard pattern, large partial patterns need to be cut out. In such case, two kinds of small-sized standard patterns 102 and 103 corresponding to features of parts of the target pattern are prepared as shown by way of example in FIGS. 9b and 9c, the standard pattern 102 is employed in the first picture surface scanning so as to obtain the positional coordinates of patterns coincident therewith, the standard pattern 103 is employed in the next picture surface scanning thereby to obtain the positional coordinates of patterns coincident therewith, and coordinates forming pairs in the specified positional relationships are sampled, whereby the patterns 31a, 31b and 31c can be detected. When the divided sections of the search area when employing the standard pattern 102 and those when employing the standard pattern 103 are set in advance in a manner to shift within the imaging field of view in conformity with the specified positional relationships, a pair of positional coordinates 32a and 33a, 32b and 33b, or 32c and 33c to be detected from the same pattern on the object can be accommodated in the section of an identical address, and the decision of the positional relationship is facilitated.

Since the image information processing apparatus explained with reference to FIG. 6 can arbitrarily set the search areas of patterns within the single imaging field of view, it can sample patterns from search areas in positions differing for the respective picture surfaces while the field of view remains fixed, and it can change standard patterns on all occasions. Accordingly, in case where all the search areas set in the object fall within the identical field of view of the imaging device, positional coordinates from different search areas can be sampled merely by repeating the picture surface scannings, and the pattern positions can be detected in a short time.

As set forth above, according to this invention, even in case where a body surface which is formed with a plurality of patterns endowed with the same feature as that of a standard pattern is an object, the position of a target pattern can be reliably detected, and hence, no restriction is imposed on the shape or arrayal of the target pattern. Accordingly, this invention can be extensively applied to position recognition systems for semiconductor products and other various bodies.

We claim:

1. A pattern position detecting system comprising imaging means to pick up an image of an object which includes a target pattern to-be-detected, first means connected with said imaging means and to successively cut out local patterns of an image surface on the basis of image signals delivered from said imaging means, second means to successively generate positional coordinates which indicate typical positions of the respective local patterns cut out, third means to compare the respective local patterns with a standard pattern having the same feature as that of the target pattern and to obtain degrees of coincidence, fourth means connected with said second and third means and to compare the degree of coincidence with the degrees of coincidence of the other local patterns in the vicinity of the particular local pattern so as to successively sample the local patterns whose degrees of coincidence become the maximum, said fourth means storing the positional coordinates and degrees of coincidence of the respective local patterns whose degrees of coincidence become the maximum, and fifth means connected with said fourth means and to sample positional coordinates fulfilling a positional relationship inherent to the target pattern from among the positional coordinates finally left in said fourth means, the sampled positional coordinates being identified as indicating a position of said target pattern.

2. A pattern position detecting system according to claim 1, wherein said fourth means comprises means to divide the imaged picture surface into a plurality of sections in advance and to generate an address of one section in which the positional coordinates generated by said second means are included, in response to said positional coordinates, memory means having a plurality of data storage areas for storing degrees of coincidence and positional coordinates in correspondence with the section addresses, and means to read out data indicative of the degrees of coincidence from the data storage areas within said memory means corresponding to said section addresses, to compare them with new degrees of coincidence provided from said third means and to replace the contents of said data storage areas with the new degrees of coincidence and positional coordinates generated by said second means, in accordance with the comparison results.

3. A pattern position detecting system according to claim 1 or 2, wherein said fifth means examines for the positional relationship for the identification of the target pattern, only those of the plurality of positional coordinates left in said fourth means whose degrees of coincidence with said standard pattern are at least a predetermined value.

4. A pattern position detecting system according to claim 2, wherein in the section address generating means, vertical and horizontal dimensions of said each section are made equal to minimum values of Y-directional and X-directional intervals among respective typical coordinates of the plurality of patterns which are included in the imaged picture surface and which have the same feature as that of the target pattern, whereby said typical coordinates of the respective patterns are located in the separate sections.

5. A pattern position detecting system according to claim 2 or 4,
further comprising sixth means to generate clock pulses which determine operating timings of said first means and said second means,
said second means comprising:
a counter which counts the clock pulses of said sixth means and which provide X-abscissas and carry pulses; and
a counter which counts the carry pulses and which provide Y-ordinates,
the section address generating means comprising:
first and second registers for storing an X-abscissa and a Y-ordinate of the first local pattern to be compared with the standard pattern;
third and fourth registers for storing values to prescribe the X-directional and Y-directional dimensions of one section;
first detection means to compare the content of said first register and the X-abscissa provided from said second means and to provide a pulse upon coincidence;
a first counter which is reset by the pulse from said first detection means and which counts the clock pulses from said sixth means;
second detection means to compare the content of said first counter and the content of said third register and to provide a pulse upon coincidence, the output pulse of said second detection means resetting said first counter;

a second counter which is reset by the output pulse of said first detection means and which counts the output pulses from said second detection means;

third detection means to compare the content of said second register and the Y-ordinate provided from said second means and to provide a pulse upon coincidence;

a third counter which is reset by the pulse from said third detection means and which counts the carry pulses of said second means;

fourth detection means to compare the content of said third counter and the content of said fourth register and to provide a pulse upon coincidence, the output pulse of said fourth means resetting said third counter; and a fourth counter which is reset by the output pulse from said third detection means and which counts the output pulses from said fourth detection means;

values of said second counter and said fourth counter being respectively provided as the X- and Y-addresses of said section.

6. A pattern position detecting system according to claim 3, wherein in the section address generating means, vertical and horizontal dimensions of said each section are made equal to minimum values of Y-directional and X-directional intervals among respective typical coordinates of the plurality of patterns which are included in the imaged picture surface and which have the same feature as that of the target pattern, whereby said typical coordinates of the respective patterns are located in the separate sections.

7. A pattern position detecting system according to claim 6, further comprising sixth means to generate clock pulses which determine operating timings of said first means and said second means, said second means comprising:

a counter which counts the clock pulses of said sixth means and which provide X-abscissas and carry pulses; and a counter which counts the carry pulses and which provide Y-ordinates;

the section address generating means comprising:

first and second registers for storing an X-abscissa and a Y-ordinate of the first local pattern to be compared with the standard pattern;

third and fourth registers for storing values to prescribe the X-directional and Y-directional dimensions of one section;

first detection means to compare the content of said first register and the X-abscissa provided from said second means and to provide a pulse upon coincidence;

a first counter which is reset by the pulse from said first detection means and which counts the clock pulses from said sixth means;

second detection means to compare the content of said first counter and the content of said third register and to provide a pulse upon coincidence, the output pulse of said second detection means resetting said first counter;

a second counter which is reset by the output pulse of said first detection means and which counts the output pulses from said second detection means;

third detection means to compare the content of said second register and the Y-ordinate provided from said second means and to provide a pulse upon coincidence;

a third counter which is reset by the pulse from said third detection means and which counts the carry pulses of said second means;

fourth detection means to compare the content of said third counter and the content of said fourth register and to provide a pulse upon coincidence, the output pulse of said fourth means resetting said third counter; and a fourth counter which is reset by the output pulse from said third detection means and which counts the output pulses from said fourth detection means;

values of said second counter and said fourth counter being respectively provided as the X- and Y-addresses of said section.

* * * * *